United States Patent [19]

Fishkin et al.

[11] Patent Number: 4,754,496
[45] Date of Patent: Jun. 28, 1988

[54] TEST AND MEASUREMENT SYSTEM FOR ANTENNAS

[75] Inventors: Theodore S. Fishkin, Torrance, Calif.; David T. La Flame, Sand Springs, Okla.; Timothy A. Crail, Los Angeles, Calif.

[73] Assignee: Hughes Aircraft Company, Los Angeles, Calif.

[21] Appl. No.: 819,964

[22] Filed: Jan. 21, 1986

[51] Int. Cl.⁴ ............................................. H04B 17/00
[52] U.S. Cl. ....................................... 455/67; 343/703
[58] Field of Search ........................... 455/67; 343/703; 342/173, 174

[56] References Cited

U.S. PATENT DOCUMENTS

| | | | |
|---|---|---|---|
| 3,825,931 | 7/1974 | Gonzalez et al. | 455/67 |
| 4,118,668 | 10/1978 | Strayer, Jr. | 455/67 |
| 4,199,668 | 4/1980 | Scozzari | 455/67 |
| 4,553,145 | 11/1985 | Evans | 343/703 |

OTHER PUBLICATIONS

IEEE Publication, "Test Procedure for Antennas", p. 16, 1/1965.

Primary Examiner—Jin F. Ng
Attorney, Agent, or Firm—S. M. Mitchell; M. J. Meltzer; A. W. Karambelas

[57] ABSTRACT

A test and measurement system for space satellite antennas which includes frequency synthesizers which are capable of shifting from frequency to frequency at high speeds with precision accuracy to provide source and reference frequencies with which the antennas may be tested; a transmitter utilizing one of the frequency synthesizers to generate test signals; an optional power monitor receiving antenna; a non coherent receiver utilizing the other of the frequency synthesizers to generate local reference frequency signals; high speed electronic switching networks connecting the various antennas to be tested with the receiver at the receiving antenna; a network for converting received signals to digital signals and storing those signals; and a computer system for controlling the transmitter, the receiver, and the switching systems, and the data converting and storage network.

8 Claims, 2 Drawing Sheets

TEST AND MEASUREMENT SYSTEM FOR ANTENNAS

BACKGROUND OF THE INVENTION

This invention relates to electrical test and measurement systems and, more particularly, to systems for testing and measuring the performance of space satellite antennas or other highly complex antennas in a far field environment.

The performance of the antennas aboard a space communications satellite is crucial to the success of the mission of that satellite. Accordingly, it is important to make extensive ground based tests and measurements on these antennas to ensure successful operation.

A typical satellite microwave antenna test program includes the measurement of antenna gain as a function of several variables. These variables may include antenna orientation in both azimuth and elevation, signal frequency, antenna pattern and signal polarization. An antenna may have more than one port through which signals are fed; and in some cases, it may be necessary to make the gain measurements using different ports. Consequently, the number of gain measurements to be made is often quite high. The physical acts and time necessary to accomplish such measurements have in the past been a major item of expense in the construction and testing of satellite communications systems.

In one particular system, for example, it is necessary that the antenna system be tested for gain using several different antenna configurations with up to six ports each with twenty individual frequencies at approximately seventy different elevation angles and seventy different azimuth angles. In addition, it is necessary to test the antenna for three different signal polarizations. In all, a total of approximately ten million individual gain measurements need be made.

The prior art method of making such measurements utilized phase locking receivers which, at best, could be moved very slowly through a limited number of frequencies due to the need to search for, locate, and lock on to each new frequency. The prior art systems often lose lock on a frequency during operation and cause the test in progress to be aborted. Moreover, prior art systems switch relatively slowly between no more than two ports. Finally, prior art systems require individual computer commands to switch, measure, store data, and to read the antenna position, a time consuming process.

It is therefore an object of the present invention to reduce the time and cost required for testing and measuring the performance of space satellite antennas.

SUMMARY OF THE INVENTION

The foregoing and other objects of the present invention are accomplished in a test and measurement system for antennas which includes frequency synthesizers which are capable of shifting from frequency to frequency at high speeds to provide extremely precise source and reference frequencies with which the antennas may be tested; a transmitting antenna which generates a test source signal; an optional power monitor receiving antenna; a receiver utilizing the reference frequency synthesizer and having non-coherent detection facilities to eliminate the need and time required for phase locking at the receiver; high speed electronic switches connecting the various antennas to be tested with the receiver at the receiving site; circuitry for digitizing and storing signals detected at the receiver; command link interfaces at the transmitter and receiver electronically linked to one another for providing signals to actuate the source synthesizer and perform various control functions associated with the transmitter; and a computer system for controlling the command link interface, the transmitter, the receiver, and the switching system.

Other objects and advantages of the invention will be better understood by reference to the specification taken in conjunction with the detailed drawing.

DETAILED DESCRIPTION OF THE INVENTION

Figure 1A:
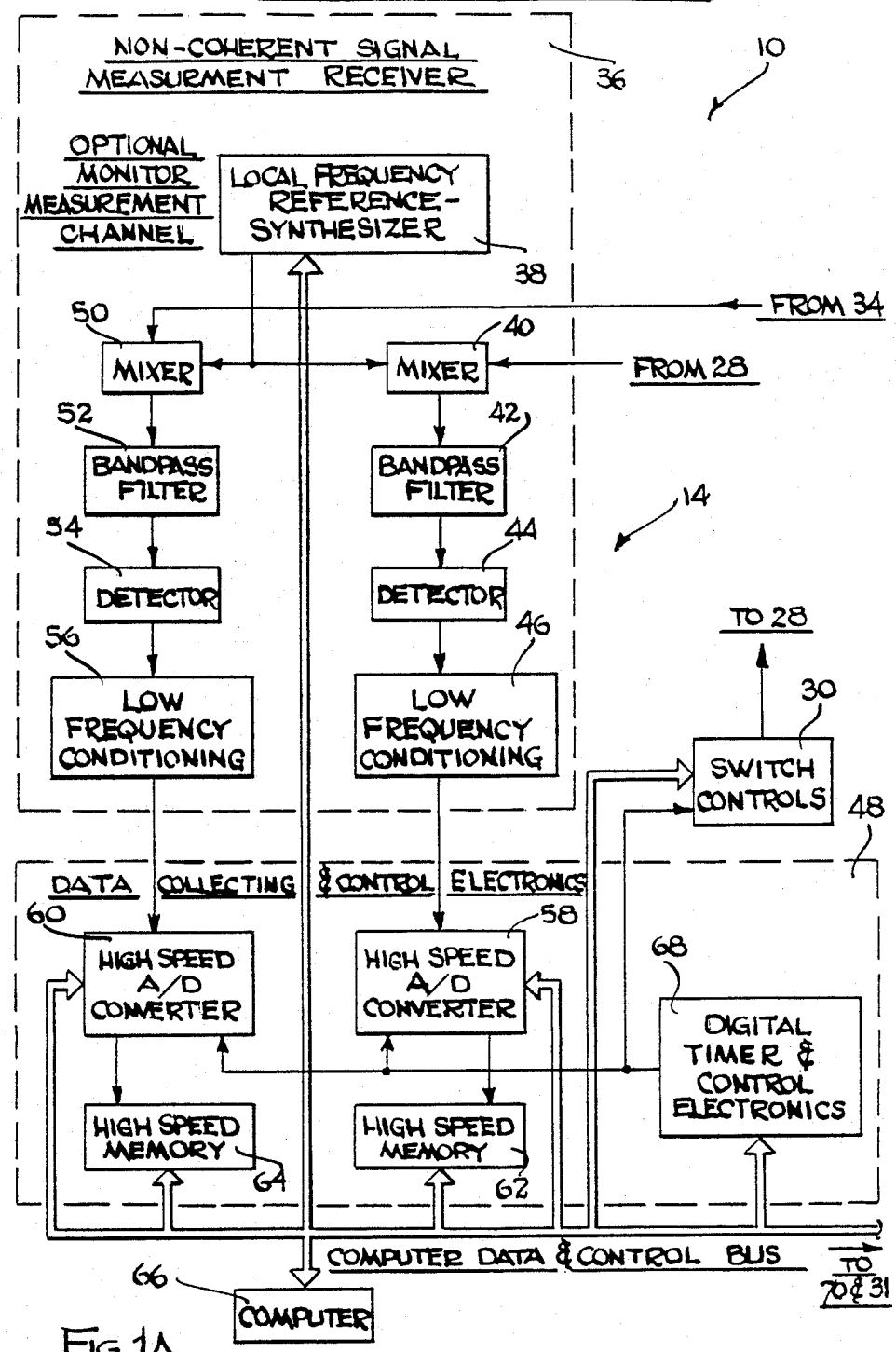
FIGS. 1A and 1B constitute a block diagram of a test and measurement system for antennas constructed in accordance with this invention.
Figure 1B:
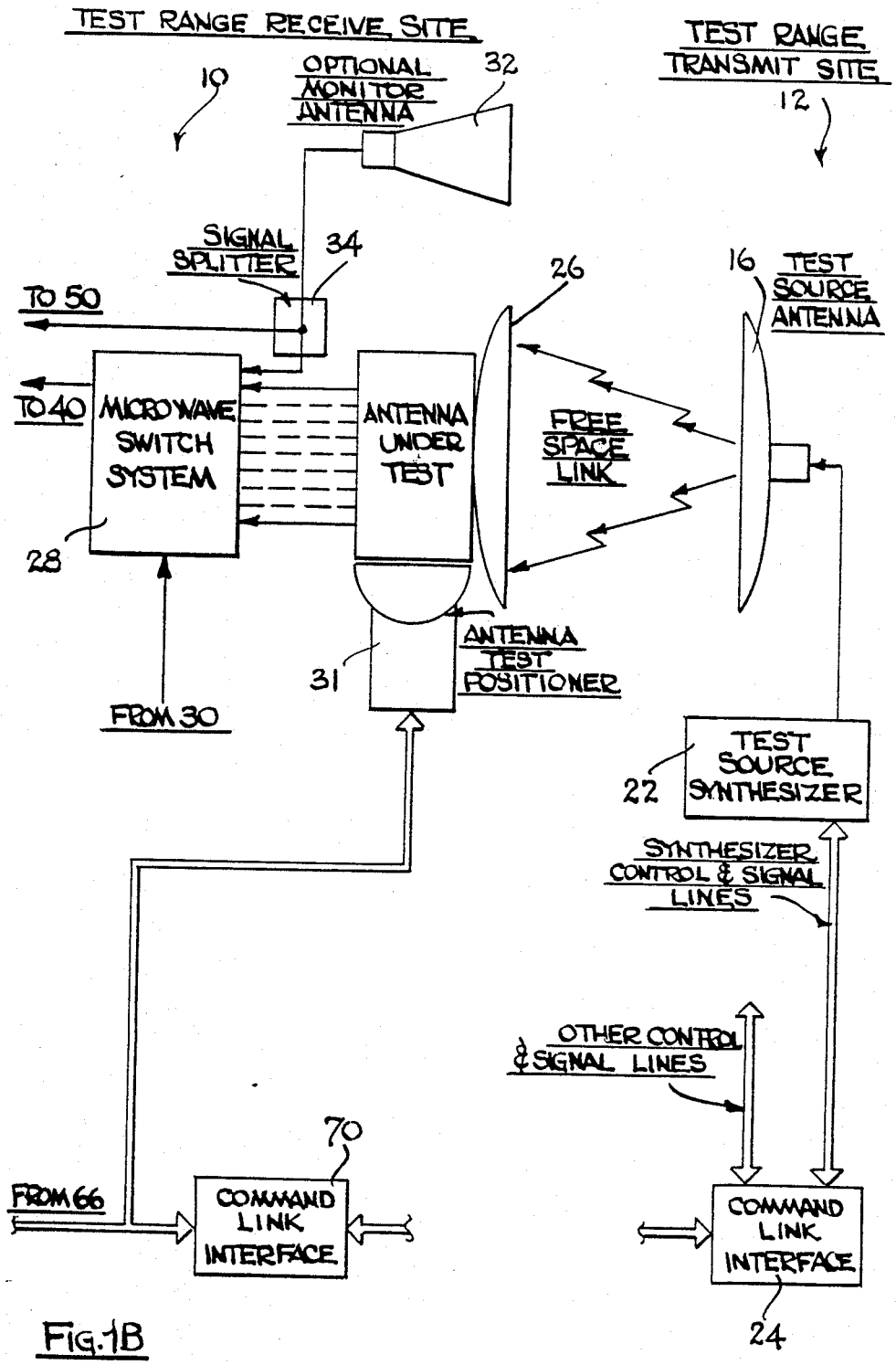

Referring now to FIGS. 1A and 1B, there is shown an antenna test and measurement system 10 comprising a transmitter section 12 and a receiver section 14. Positioned at the transmitter section 12 is a source antenna 16. The antenna 16 has associated with it the various devices such as feed horns (none of which are shown in the Figure) utilized to furnish microwave energy to the physical antenna structure 16 in order to enable the transmission of selected microwave frequencies by the transmitting antenna 16.

The antenna 16 receives signals from a frequency synthesizer 22. The frequency synthesizer 22 is commanded to provide microwave signals of various frequencies, depending upon the particular wavelength being tested, in accordance with commands from a command link interface 24. The command link interface 24 may also provide other signals to the transmitter section 12 for accomplishing the selection of desired source antenna characteristics.

Signals transmitted by the antenna 16 are received at the receiver section 14 by an antenna 26, the antenna undergoing test. The antenna 26 provides its received signals at it's output ports (not shown in the figure) to a microwave switch system 28 so that these signals may be tested. The system 28 is controlled by an electronic switch control system 30 which selects the particular antenna port for measurement at any particular instant of the test sequence. The switch control system 30 comprises an arrangement such as shift registers for rapidly switching through the sequence of diode switches available in the system 28 which may include high speed solid state PIN diode switches adapted to provide high isolation between signals.

It should be noted that the antenna 26 and the system 28 are positioned on a movable platform (not shown) which is controlled by a positioner 31 to position the antenna 26, both in the horizontal (azimuth) and vertical (elevation) directions. The platform may be constructed in a conventional manner.

Also positioned at the receiver section 14, but off the platform, is a second optional antenna 32 for receiving signals transmitted by the antenna 16. The antenna 32 is in a constant stationary position to monitor variations in the power of the received signal. These signals are utilized in order to determine whether variations in the atmosphere, signal transmitted, or the signal path are affecting the reception by the antenna 26 and the test results. Signals from the antenna 32 are transferred to a splitter 34 and from thence to the switch system 28 and to a receiver 36.

The receiver 36 has a frequency synthesizer 38 which is utilized to provide local reference frequencies for use therein. The selection of frequency for the synthesizer 38 is made at essentially the same time that the selection of frequency is made for the synthesizer 22 so that delays in waiting for the synthesizer 38 to adjust from one frequency to another (as in prior art systems) are minimized. Depending upon the signal frequency being sent by the antenna 16, the local reference frequency is varied at a fixed offset from the transmit frequency to provide a signal to a mixer stage 40 where it is mixed with the signal received by the antenna 26 to generate an intermediate frequency shifted into the desired frequency range. The mixer 40 may also amplify the signal to allow a more accurate measurement.

The intermediate frequency signal is transferred from the mixer 40 to a band pass filter system 42 which rejects out of band interference and noise to improve the signal-to-noise ratio. It should be noted that the extremely accurate frequencies provided by the synthesizers 22 and 38 allow very narrow bandwidth filters 42 and, consequently, much better signal-to-noise ratio than prior art systems. The filtered signal is then transferred to a non-coherent detector 44 which transforms the signal to a low frequency signal. A non-coherent detector 44 such as a logarithmic amplifier, a square law detector, or a linear detector is utilized in the system. Accordingly, it is not necessary for testing purposes for the system 10 to wait until the receiver 36 is locked into phase with the signals received by the antenna 26. This saves a substantial period of time in measuring gain at each particular measurement.

Signals from the detector 44 are passed to a low frequency conditioning circuit 46 and thence to a data collecting and control electronics system 48 where signals are collected and stored.

Signals from the power monitoring antenna 32 may be transferred from the splitter 34 by the controls 30 and caused to follow the same path as the signals from the antenna 26 so that a gain comparison may be derived. In such a case, the signals from the antenna 32 must be processed at a slightly different time than those from the antenna 26.

Signals from the antenna 32 may also be transferred by the splitter 34 to a mixer stage 50 in the receiver 36 where they are mixed with the reference frequencies generated by the synthesizer 38 to provide signals of an appropriate intermediate frequency. These signals are passed by a band pass filter 52 to a non-coherent detector 54. As with the detector 44, the non-coherent detector 54 provides for rapidly handling the signals from the antenna 32 without requiring that phase lock with the incoming signal be accomplished.

After leaving the non-coherent detector 54, the signals are passed by a low frequency conditioning stage 56 to the data collecting and control electronics 48.

By providing two paths for signals from the antenna 32, a comparison may be made to determine whether any of the signal carrying system is failing.

The data collection and control electronics 48 includes a high speed analog to digital converter 58 which receives signals transferred from the stage 46 of the receiver 36 and a second high speed analog to digital converter 60 which receives the signals from the stage 56 of the receiver 36 originating at the antenna 32. Each of the converters 58 and 60 converts the analog information to digital information for easy storage. Signals received by the high speed analog to digital converter 58 are immediately transferred to a high speed data memory 62. The signals received by the high speed analog to digital converter 60 are immediately transferred to a high speed data memory 64. The data collection and control electronics 48 also includes digital timer and control electronics 68 which control the operation of the converters 58 and 60.

A computer system 66, in a preferred embodiment, transfers commands to operate the entire system 10. This control is accomplished by signals sent from the computer 66 to a second command link interface 70 for transfer to the command link interface 24 at the transmit site, to the digital timer and control electronic circuit 68 which controls the electronic switching control system 30, to the switching control system 30, to the antenna test platform positioner 31 which controls the position of the receiving antenna 26, to the high speed memories 62 and 64, and to the synthesizer 38. The signal transfer from the interface 70 to the interface 24 may be accomplished via a modem and the local telephone system (neither of which is shown) or by other means well known to the art.

The operation of the system 10 takes place as follows. The antenna 26 mounted on a movable platform 31 is moved to an initial position, the switch controls are set to an initial state, and the synthesizers 22 and 38 are set to initial frequencies under control of the computer 66. In a preferred embodiment, the antenna 26 is moved to its lowest elevation at either the left or right extreme azimuth. During operation, the antenna 26 is caused by the positioner controls 31 of the platform to scan at a first elevation across the range of azimuths at a speed selected to allow measurements to be made. The elevation of the antenna 26 is then raised, and a scan in the other direction takes place.

Measurements are made by the system 10 on the fly as the antenna 26 moves through a scan at each elevation. In the preferred embodiment, these measurements occur at each 0.3 degrees. In the preferred embodiment, the computer 66 reads the position of the antenna 26 as the antenna scans. AT each point of the scan, the computer system 66 generates a single signal which is transferred to the two synthesizers 22 and 38 and to the timer 68. The signal to the synthesizer 22 is transferred by way of the command link interface 70 and the command link interface 24 and commands that synthesizer 22 to select a particular frequency for transmission by the antenna 16.

In a preferred embodiment, the frequency synthesizer 22 may be a Hewlett Packard Model 8673A Synthesized Signal Generator which is able to change frequencies very rapidly and to rapidly and precisely stablize at a particular frequency to be transmitted. The signal generated by the frequency synthesizer 22 is transferred to and transmitted by the antenna 16.

The signal generated by the computer 66 and transferred to the control electronics 68 initiates a series of pulses to the analog-to-digital converters 58 and 60 and to the electronic switch control 30. Each of the series of pulses causes the converters 58 and 60 to process its received signal, and the switch control 30 to select the next sequential one of the available ports for the receiving antenna 26. The control 30 may utilize MD-19C2D one pole, eight throw switch drivers manufactured by Micro-Dynamics, Inc., which provide approximately ninety dB isolation between signals. Thus, each particular signal transmitted by the antenna 16 is received by the antenna 26 and 32 and is measured sequentially at each of the antenna ports selected.

While the antenna 26 moves, the antenna 32 remains in one particular position during the entire testing sequence to provide a standard for monitoring the power of the transmitted signal. The signal received by the antenna 32 is transmitted by the splitter 34 to the electronic switching controls 30 and the receiver 36. The signal received at the antenna 26 is transferred by the switch system 28 under control of switching controls 30 to the receiver 36.

At the receiver 36, the signal from the computer 66 causes the reference frequency synthesizer 38 to generate and rapidly stabilize at a reference frequency selected by the computer 66 for use by the mixers 40 and 50 to match the received signals of each transmitted frequency. In a preferred embodiment, the local frequency synthesizer 38 may also comprise a Hewlett Packard Model 8673A Programmable Synthesized Signal Generator which is adapted to provide very rapid and accurate switching between frequencies under control of the computer system 66. It will be appreciated by those skilled in the art that the signals sent by the computer 66 to select a particular frequency at the frequency synthesizer 22 and the local frequency synthesizer 38 are adapted to select particular paired frequencies, at a constant offset which is the intermediate frequency.

The signals from the antennas 26 and 32 are transferred through their individual sections of the receiver 36 and therefrom to the data collecting and control electronics 48. In the preferred embodiment, a Hewlett Packard 6942A Multiprogrammer may be utilized to accomplish the data acquisition. In a preferred embodiment of the invention, the computer 66 may comprise a Hewlett Packard Model 9920 computer. The computer 66 may, at selected intervals, send signals to the high speed memories 62 and 64 of the data collecting and control electronics 48 to initiate the readout of data stored in the memories 62 and 64.

After the measurements for a first frequency are complete for all antenna ports and while the antenna 26 is still at essentially the same position, the computer 66 sends its next signal which selects the frequency to be transmitted for the test. This continues until all frequencies for a particular position have been sent and received. In a preferred embodiment, the antenna 26 will have moved less than 0.3 degrees during this period so that when the appropriate antenna angle is reached, a new set of test frequencies may be initiated. This continues until the antenna 26 has scanned the entire range of azimuth angles at the particular elevation and is moved to the next elevation. The speed with which this occurs compared to earlier testing systems (approximately ten times) will be appreciated by those skilled in the art.

Although the invention has been described herein with reference to a particular detailed embodiment, many modifications will occur to those skilled in the art which are within the spirit and scope of the invention. It is, therefore, intended that the invention be limited only by the language of the claims which are appended hereto.

What is claimed is:

1. A test and measurement system for antennas comprising a first microwave frequency synthesizer capable of shifting rapidly and precisely between frequencies being generated, a transmitting antenna, means for directing synthesized signals of selected frequencies to the transmitting antenna, a receiver, means for directing signals received from the transmitting antenna by an antenna to be tested to the receiver, the directing means including a switch network that has high isolation PIN diode microwave switches; a second microwave frequency synthesizer capable of shifting rapidly and precisely between frequencies being generated for providing local reference frequencies for the receiver, means for coincidentally selecting signals to be generated by the first and second frequency synthesizers, and means for storing signals received by the antenna being tested.

2. A test and measurement system for antennas as in claim 1 further including a monitoring antenna, means for directing signals from the monitoring antenna to the receiver, and means for storing signals received by the monitoring antenna.

3. A test and measurement system for antennas as claimed in claim 2 in which the receiver includes a first receiving channel for processing signals from the antenna being tested, and a second receiving channel for processing signals from the monitoring antenna.

4. A test and measurement system for antennas as claimed in claim 3 in which each of the receiver channels includes non-coherent detection means.

5. A test and measurement system for antennas as claimed in claim 1 further comprising means for varying the position of the antenna being tested.

6. A test and measurement system for antennas as claimed in claim 1 further comprising a computer for controlling the timing and operation of the entire system.

7. A test and measurement system for antennas as claimed in claim 6 in which the means for directing signals received from the transmitting antenna by an antenna to be tested to the receiver includes switching means for rapidly selecting particular ports of the antenna to be tested under control of the computer.

8. A test and measurement system for antennas comprising:
a computer for controlling the timing and operation of the entire system;
a first frequency synthesizer capable of shifting rapidly and precisely between frequencies being generated;
a transmitting antenna;
means for directing synthesized signals of selected frequencies to the transmitting antenna;
a receiver;
means for directing signals received from the transmitting antenna by an antenna to be tested to the receiver, the signal directing means including switching means for rapidly selecting particular ports of the antenna to be tested under the control of the computer;
a second frequency synthesizer capable of shifting rapidly and precisely between frequencies being generated for providing local reference frequencies for the receiver;
the computer also including means for coincidentally selecting signals to be generated by the first and second frequency synthesizers; and
means for storing signals received by the antenna being tested.

* * * * *